US010910818B2

United States Patent
Li et al.

(10) Patent No.: US 10,910,818 B2
(45) Date of Patent: Feb. 2, 2021

(54) ANTI-SHORT-CIRCUIT DETECTION APPARATUS AND USER TERMINAL

(71) Applicant: Huawei Technologies Co., Ltd., Shenzhen (CN)

(72) Inventors: Deliang Li, Shenzhen (CN); Zexu Qian, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 381 days.

(21) Appl. No.: 15/767,021

(22) PCT Filed: Apr. 28, 2016

(86) PCT No.: PCT/CN2016/080566
§ 371 (c)(1),
(2) Date: Apr. 9, 2018

(87) PCT Pub. No.: WO2017/185311
PCT Pub. Date: Nov. 2, 2017

(65) Prior Publication Data
US 2019/0067931 A1 Feb. 28, 2019

(51) Int. Cl.
*H02H 3/16* (2006.01)
*G01R 31/52* (2020.01)
*H02H 7/20* (2006.01)
*H02H 1/00* (2006.01)

(52) U.S. Cl.
CPC ............... *H02H 3/16* (2013.01); *G01R 31/52* (2020.01); *H02H 1/0007* (2013.01); *H02H 7/20* (2013.01)

(58) Field of Classification Search
CPC .......... H02H 1/0007; H02H 3/05; H02H 3/16; H02H 7/20; G01R 31/52
See application file for complete search history.

(56) References Cited

U.S. PATENT DOCUMENTS

| 4,965,693 A | 10/1990 | Aoki |
| 2009/0295401 A1 | 12/2009 | Kamata |

(Continued)

FOREIGN PATENT DOCUMENTS

| CN | 201383666 Y | 1/2010 |
| CN | 101738562 A | 6/2010 |

(Continued)

OTHER PUBLICATIONS

Foreign Communication From a Counterpart Application, European Application No. 16899824.3, Extended European Search Report dated Sep. 18, 2018, 7 pages.

(Continued)

*Primary Examiner* — Fred E Finch, III
(74) *Attorney, Agent, or Firm* — Conley Rose, P.C.

(57) ABSTRACT

An anti-short-circuit detection apparatus includes a probe, a detection resistor, a switching circuit, and a detection circuit. The probe is disposed between a power port and a ground port. A first terminal of the detection resistor is electrically coupled to a power circuit of the user terminal, and a second terminal of the detection resistor is electrically coupled to the probe. The switching circuit is electrically coupled to the first terminal of the detection resistor and a processor of the user terminal and is configured to perform switching to be grounded or ungrounded under the control of the processor. The detection circuit is electrically coupled to two terminals of the detection resistor and the processor, and is configured to trigger the processor to control the user terminal to issue a short-circuit warning or turn off the power circuit when the short-circuit current is not zero.

17 Claims, 3 Drawing Sheets

(56) References Cited

U.S. PATENT DOCUMENTS

| | | |
|---|---|---|
| 2010/0033883 A1 | 2/2010 | Simon |
| 2012/0239319 A1 | 9/2012 | Singh |
| 2014/0191874 A1 | 7/2014 | Stevens et al. |
| 2015/0229119 A1* | 8/2015 | Tao ............... H02H 1/0007 361/91.1 |
| 2017/0259577 A1 | 9/2017 | Wang et al. |

FOREIGN PATENT DOCUMENTS

| | | |
|---|---|---|
| CN | 101945534 A | 1/2011 |
| CN | 103871340 A | 6/2014 |
| CN | 203772995 U | 8/2014 |
| CN | 104067184 A | 9/2014 |
| CN | 105182154 A | 12/2015 |
| CN | 105322397 A | 2/2016 |
| JP | H02136021 A | 5/1990 |
| JP | 2014516402 A | 7/2014 |
| JP | 2015008582 A | 1/2015 |
| KR | 20140099930 A | 8/2014 |
| WO | 2015096282 A1 | 7/2015 |

OTHER PUBLICATIONS

Machine Translation and Abstract of Japanese Publication No. JP2015008582, Jan. 15, 2015, 20 pages.
Foreign Communication From a Counterpart Application, Japanese Application No. 2018-540194, Japanese Notice of Allowance dated Mar. 19, 2019, 3 pages.
Machine Translation and Abstract of Chinese Publication No. CN101738562, Jun. 16, 2010, 9 pages.
Machine Translation and Abstract of Chinese Publication No. CN101945534, Jan. 12, 2011, 7 pages.
Machine Translation and Abstract of Chinese Publication No. CN103871340, Jun. 18, 2014, 8 pages.
Machine Translation and Abstract of Chinese Publication No. CN105182154, Dec. 23, 2015, 8 pages.
Machine Translation and Abstract of Chinese Publication No. CN105322397, Feb. 10, 2016, 10 pages.
Machine Translation and Abstract of Chinese Publication No. CN201383666, Jan. 13, 2010, 5 pages.
Machine Translation and Abstract of Chinese Publication No. CN203772995, Aug. 13, 2014, 8 pages.
Foreign Communication From a Counterpart Application, PCT Application No. PCT/CN2016/080566, English Translation of International Search Report dated Dec. 27, 2016, 3 pages.
Machine Translation and Abstract of Korean Publication No. KR20140099930, Aug. 13, 2014, 26 pages.
Foreign Communication From a Counterpart Application, Korean Application No. 10-2018-7011226, Korean Office Action dated Feb. 25, 2019, 6 pages.
Foreign Communication From a Counterpart Application, Korean Application No. 10-2018-7011226, English Translation of Korean Office Action dated Feb. 25, 2019, 4 pages.

* cited by examiner

ANTI-SHORT-CIRCUIT DETECTION APPARATUS AND USER TERMINAL

CROSS-REFERENCE TO RELATED APPLICATION

This application is a U.S. National Stage of International Patent Application No. PCT/CN2016/080566 filed on Apr. 28, 2016, which is hereby incorporated by reference in its entirety.

TECHNICAL FIELD

The present disclosure relates to the field of electronic technologies, and in particular, to an anti-short-circuit detection apparatus and a user terminal to which the anti-short-circuit detection apparatus is applied.

BACKGROUND

In a user terminal such as a computer, a mobile phone, and a tablet computer, a peripheral interface such as a universal serial bus (USB) interface is usually reserved to connect to a peripheral device. The peripheral interface may be connected to a charger or an external power supply in order to supply power to the user terminal using the charger or the external power supply, or to supply, by the user terminal using the peripheral interface, power to the peripheral device connected to the peripheral interface. Because a peripheral interface of a user terminal is exposed in most cases in daily use, it is inevitable that a short-circuit fault occurs when the peripheral interface comes into contact with conductive liquid. For example, when water droplets are condensed on the peripheral interface because of alternation between hot and cold air, or when a user accidentally splashes liquid such as tea on the peripheral interface during use of the user terminal, a short circuit may exist between a power cable and a ground cable that are of the peripheral interface, and the user terminal or the peripheral device is burned, causing an irreparable loss.

Currently, manufacturers of user terminal products with peripheral interfaces usually recommend, in product manuals, that users should keep the products dry for use or equip the products with water-proof mechanical parts in order to perform sealing treatment on the peripheral interfaces when the peripheral interfaces do not need to be used. However, in daily use, a careless user may not notice conductive liquid on a peripheral interface, causing a short-circuit fault during use. Moreover, although equipping a water-proof mechanical part can have a relatively desirable water-proof effect, design and production costs of a product are increased to some extent, and use of the water-proof mechanical part is not conducive to enhancing product appearance.

SUMMARY

Embodiments of the present disclosure provide an anti-short-circuit detection apparatus in order to implement automatic detection of a short-circuit fault for a user terminal, and control the user terminal to issue a short-circuit warning or control the user terminal to turn off a power circuit when detecting that a short-circuit fault occurs, preventing the user terminal from being damaged because of the short-circuit fault.

A first aspect of the embodiments of the present disclosure provides an anti-short-circuit detection apparatus, which is configured to detect whether a short circuit exists between a power port and a ground port that are of a user terminal, where the anti-short-circuit detection apparatus includes a probe, a detection resistor, a switching circuit, and a detection circuit, where the probe is disposed between the power port and the ground port, and at least one portion of the probe is located between the power port and the ground port, a first terminal of the detection resistor is electrically connected to a power circuit of the user terminal, and is configured to obtain an auxiliary voltage from the power circuit, and a second terminal of the detection resistor is electrically connected to the probe, the switching circuit is electrically connected to the first terminal of the detection resistor and a processor of the user terminal, and is configured to switch the first terminal of the detection resistor to be grounded or ungrounded under the control of the processor, and the detection circuit is electrically connected to two terminals of the detection resistor and the processor, and is configured to detect a short-circuit current on the detection resistor, and trigger the processor to control the user terminal to issue a short-circuit warning or turn off the power circuit when the short-circuit current is not zero.

In the anti-short-circuit detection apparatus, the probe is disposed between the power port and the ground port, the probe is electrically connected to the power circuit of the user terminal using the detection resistor, and the switching circuit may perform switching to be grounded such that whether a short-circuit fault occurs between the power port and the ground port can be determined by detecting, by the detection circuit, whether a short-circuit current exists on the detection resistor, and when a short-circuit fault occurs between the power port and the ground port, the user terminal is triggered to issue a short-circuit warning or turn off the power circuit. This can effectively prevent parts and components of the user terminal from being damaged because of the short-circuit fault.

With reference to the first aspect, in a first possible implementation of the first aspect, the detection circuit includes a first detection circuit and a second detection circuit, when the switching circuit switches the first terminal of the detection resistor to be ungrounded, the first detection circuit is configured to detect a current in a first direction on the detection resistor, and convert the current in the first direction into a first voltage, and when the switching circuit switches the first terminal of the detection resistor to be grounded, the second detection circuit is configured to detect a current in a second direction on the detection resistor, and convert the current in the second direction into a second voltage.

In the anti-short-circuit detection apparatus, the switching circuit is disposed, when a short-circuit fault occurs between the power port and the ground port, the switching circuit can switch the first terminal of the detection resistor to be grounded or ungrounded such that the detection resistor forms a loop with the ground, and further the current in the first direction and the current in the second direction are formed separately. This helps further determine whether a short-circuit fault occurs between the power port and the ground port, by detecting the current on the detection resistor by the first detection circuit or the second detection circuit.

With reference to the first possible implementation of the first aspect, in a second possible implementation of the first aspect, the detection apparatus further includes a diode, a positive electrode of the diode is electrically connected to the power circuit, and a negative electrode of the diode is electrically connected to the first terminal of the detection resistor, the current in the first direction flows from the power circuit to the probe through the diode and the detection resistor, and the probe is grounded using a first short-circuit resistor, and the current in the second direction flows from the power port to the detection resistor through a second short-circuit resistor and the probe, and the detection resistor is grounded using the switching circuit.

With reference to the first possible implementation of the first aspect or the second possible implementation of the first aspect, in a third possible implementation of the first aspect, the first detection circuit includes a first amplifier, a first transistor, a first resistor, a second resistor, and a third resistor, the first amplifier includes a first input end, a second input end, and an output end, the first input end is connected to the first terminal of the detection resistor using the first resistor, the second input end is connected to the second terminal of the detection resistor using the second resistor, the output end is connected to a base of the first transistor, a collector of the first transistor is connected to the second input end, and an emitter of the first transistor is electrically connected to the processor and is grounded using the third resistor.

In the first detection circuit, the first input end of the first amplifier is connected to the first terminal of the detection resistor, the second input end of the first amplifier is connected to the second terminal of the detection resistor, and the output end of the first amplifier is connected to the processor using the first transistor such that the current in the first direction on the detection resistor can be converted into the first voltage. The processor can determine whether the current in the first direction exists on the detection resistor only by detecting whether the first voltage is zero in order to determine whether a short-circuit fault occurs between the power port and the ground port.

With reference to the first possible implementation of the first aspect or the second possible implementation of the first aspect, in a fourth possible implementation of the first aspect, the second detection circuit includes a second amplifier, a second transistor, a fourth resistor, a fifth resistor, and a sixth resistor, the second amplifier includes a first input end, a second input end, and an output end, the first input end is connected to the second terminal of the detection resistor using the fourth resistor, the second input end is connected to the first terminal of the detection resistor using the fifth resistor, the output end is connected to a base of the second transistor, a collector of the second transistor is connected to the second input end, and an emitter of the second transistor is electrically connected to the processor and is grounded using the sixth resistor.

In the second detection circuit, the first input end of the second amplifier is connected to the second terminal of the detection resistor, the second input end of the second amplifier is connected to the first terminal of the detection resistor, and the output end of the second amplifier is connected to the processor using the second transistor such that the current in the second direction on the detection resistor can be converted into the second voltage. The processor can determine whether the current in the second direction exists on the detection resistor only by detecting whether the second voltage is zero in order to determine whether a short-circuit fault occurs between the power port and the ground port.

With reference to the fourth possible implementation of the first aspect, in a fifth possible implementation of the first aspect, the switching circuit includes a third transistor and a seventh resistor, a base of the third transistor is electrically connected to the processor, a collector of the third transistor is connected to the first terminal of the detection resistor, and an emitter of the third transistor is grounded using the seventh resistor.

In the switching circuit, the base of the third transistor is connected to the processor, the collector is connected to the first terminal of the detection resistor, and the emitter is grounded using the seventh resistor. Therefore, the processor can control, by outputting a high level control signal, the third transistor to be conducted in order to switch the first terminal of the detection resistor to be grounded, or the processor can control, by outputting a low level control signal, the third transistor to cut off in order to switch the first terminal of the detection resistor to be ungrounded.

With reference to the third possible implementation of the first aspect, in a sixth possible implementation of the first aspect, when a voltage at the first terminal of the detection resistor is greater than a voltage at a location of the probe, a direction of a current on the detection resistor is the first direction, and a relationship between the current in the first direction on the detection resistor and the first voltage includes $Is1=(Vo1-Vo2\times(R2+R3)/R3)/RS$, where $Is1$ is the current in the first direction on the detection resistor, $Vo1$ is the first voltage, $R2$ is a resistance value of the second resistor, $R3$ is a resistance value of the third resistor, and $RS$ is a resistance value of the detection resistor.

According to the relationship between the current in the first direction on the detection resistor and the first voltage, it indicates that the current in the first direction exists on the detection resistor provided that the first voltage is not zero. Therefore, the processor can determine whether the current in the first direction exists on the detection resistor, by detecting whether the first voltage is zero in order to determine whether a short-circuit fault occurs between the power port and the ground port.

With reference to the fifth possible implementation of the first aspect, in a seventh possible implementation of the first aspect, when a voltage at the first terminal of the detection resistor is less than a voltage at a location of the probe, a direction of a current on the detection resistor is the second direction, and a relationship between the current in the second direction on the detection resistor and the second voltage includes $Is2=(Vo2-Vo2/R6\times(R7//(R5+R6)))/RS$, where $Is$ is the current in the second direction on the detection resistor, $Vo2$ is the second voltage, $R5$ is a resistance value of the fifth resistor, $R6$ is a resistance value of the sixth resistor, $R7$ is a resistance value of the seventh resistor, and $RS$ is a resistance value of the detection resistor.

According to the relationship between the current in the second direction on the detection resistor and the second voltage, it indicates that the current in the second direction exists on the detection resistor provided that the second voltage is not zero. Therefore, the processor can determine whether the current in the second direction exists on the detection resistor, by detecting whether the second voltage is zero in order to determine whether a short-circuit fault occurs between the power port and the ground port.

With reference to the seventh possible implementation of the first aspect, in an eighth possible implementation of the first aspect, the expression $R7//(R5+R6)$ represents a total resistance $R$ obtained after connecting $R7$ in parallel with $R5$ and $R6$ that are connected in series, and for the total resistance $R$, the following relationship holds true: $R=R7\times(R5+R6)/(R5+R6+R7)$.

A second aspect of the embodiments of the present disclosure provides a user terminal, including a peripheral interface and an anti-short-circuit detection apparatus, where the anti-short-circuit detection apparatus includes a probe, a detection resistor, a switching circuit, and a detection circuit, the peripheral interface includes a power port and a ground port, the probe is disposed between the power port and the ground port, and at least one portion of the probe is located between the power port and the ground port, a first terminal of the detection resistor is electrically connected to a power circuit of the user terminal, and is configured to obtain an auxiliary voltage from the power circuit, and a second terminal of the detection resistor is electrically connected to the probe, the switching circuit is electrically connected to the first terminal of the detection resistor and a processor of the user terminal, and is configured to switch the first terminal of the detection resistor to be grounded or ungrounded under the control of the processor, and the detection circuit is electrically connected to two terminals of the detection resistor and the processor, and is configured to detect a short-circuit current on the detection resistor, and when the short-circuit current is not zero, trigger the processor to control the user terminal to issue a short-circuit warning or turn off the power circuit.

With reference to the second aspect, in a first possible implementation of the second aspect, the anti-short-circuit detection apparatus is the anti-short-circuit detection apparatus according to any one of the first possible implementation of the first aspect to the eighth possible implementation of the first aspect of the present disclosure.

With reference to the second aspect or the first possible implementation of the second aspect, in a second possible implementation of the second aspect, the probe is disposed between the power port and the ground port. The probe is disposed between the power port and the ground port such that when a short-circuit fault occurs between the power port and the ground port, a short circuit also exists between the probe and the power port and a short circuit also exists between the probe and the ground port. In this case, a voltage is formed across the probe, and according to a voltage difference between the voltage and a voltage at the first terminal of the detection resistor, a current in a first direction or a current in a second direction is formed across the detection resistor.

With reference to the second aspect or the first possible implementation of the second aspect, in a third possible implementation of the second aspect, the probe is disposed around the power port. The probe is disposed around the power port such that at least one portion of the probe is located between the power port and the ground port. Therefore, when a short-circuit fault occurs between the power port and the ground port, a short circuit also exists between the probe and the power port and a short circuit also exists between the probe and the ground port. In this case, a voltage is formed across the probe, and according to a voltage difference between the voltage and a voltage at the first terminal of the detection resistor, a current in a first direction or a current in a second direction is formed across the detection resistor.

The anti-short-circuit detection apparatus is disposed in the user terminal such that the anti-short-circuit detection apparatus can detect whether a short-circuit fault occurs between the power port and the ground port, and when detecting that a short-circuit fault occurs between the power port and the ground port, trigger the user terminal to issue a short-circuit warning or turn off the power circuit. This can effectively prevent the parts and components of the user terminal from being damaged because of the short-circuit fault.

BRIEF DESCRIPTION OF DRAWINGS

To describe the technical solutions in the embodiments of the present disclosure more clearly, the following briefly describes the accompanying drawings required for describing the embodiments.

DESCRIPTION OF EMBODIMENTS

The following describes the technical solutions in the embodiments of the present disclosure with reference to the accompanying drawings in the embodiments of the present disclosure.

Figure 1:
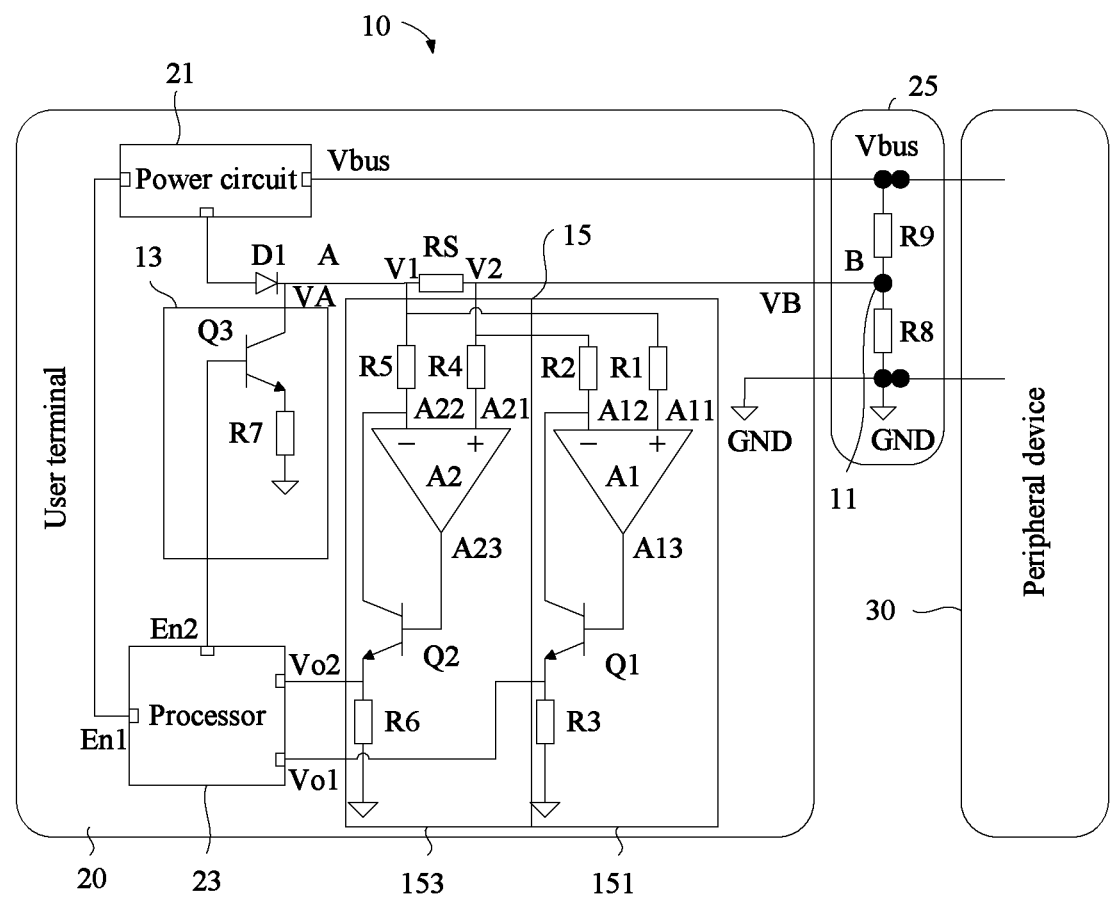
FIG. 1 is a schematic structural diagram of an anti-short-circuit detection apparatus according to an embodiment of the present disclosure.

Referring to FIG. 1, in an embodiment of the present disclosure, an anti-short-circuit detection apparatus 10 is provided, which is configured to detect whether a short circuit exists between a power port (Vbus) and a ground port (GND) that are of a user terminal 20. The anti-short-circuit detection apparatus 10 includes a probe 11, a detection resistor (RS), a switching circuit 13, and a detection circuit 15.

The probe 11 is disposed between the Vbus and the GND, and at least one portion of the probe 11 is located between the Vbus and the GND.

A first terminal of the RS is electrically connected to a power circuit 21 of the user terminal 20, and is configured to obtain an auxiliary voltage from the power circuit 21. A second terminal of the RS is electrically connected to the probe 11.

The switching circuit 13 is electrically connected to the first terminal of the RS and a processor 23 of the user terminal 20, and is configured to switch the first terminal of the RS to be grounded or ungrounded under the control of the processor 23.

The detection circuit 15 is electrically connected to two terminals of the RS and the processor 23, and is configured to detect a short-circuit current on the RS, and trigger the processor 23 to control the user terminal 20 to issue a short-circuit warning or turn off the power circuit 21 when the short-circuit current is not zero.

The user terminal 20 may be, but not limited to, a mobile phone, a tablet computer, a notebook computer, or a desktop computer. The Vbus and the GND may be a power cable and a ground cable in a peripheral interface 25 (for example, a power interface) of the user terminal 20. The processor 23 includes a first enabling end En1. The first enabling end En1 is electrically connected to the power circuit 21, and is configured to control the power circuit 21 to be turned on or turned off. When water goes into the peripheral interface 25 of the user terminal 20 by accident, a short circuit may occur between the Vbus and the GND, and consequently, parts and components of the user terminal 20 are damaged. Therefore, the probe 11 is disposed between the Vbus and the GND, the probe 11 is electrically connected to the power circuit 21 of the user terminal 20 using the RS, and the switching circuit 13 may perform switching to be grounded such that whether a short-circuit fault occurs between the Vbus and the GND can be determined by detecting, by the detection circuit 15, whether a short-circuit current exists on the RS, and when a short-circuit fault occurs between the Vbus and the GND, the user terminal 20 is triggered to issue a short-circuit warning or turn off the power circuit 21. This can effectively prevent the parts and components of the user terminal 20 from being damaged because of the short-circuit fault.

The detection circuit 15 includes a first detection circuit 151 and a second detection circuit 153. When the switching circuit 13 switches the first terminal of the RS to be ungrounded, the first detection circuit 151 is configured to detect a current in a first direction on the RS, and convert the current in the first direction into a first voltage (Vo1). When the switching circuit 13 switches the first terminal of the RS to be grounded, the second detection circuit 153 is configured to detect a current in a second direction on the RS, and convert the current in the second direction into a second voltage (Vo2).

The detection apparatus 10 further includes a diode (D1), a positive electrode of the D1 is electrically connected to the power circuit 21, and a negative electrode of the D1 is electrically connected to the first terminal of the RS. The current in the first direction flows from the power circuit 21 to the probe 11 through the D1 and the RS, and the probe 11 is grounded using a first short-circuit resistor (R8). The current in the second direction flows from the Vbus to the RS through a second short-circuit resistor (R9) and the probe 11, and the RS is grounded using the switching circuit 13. It can be understood that the R8 is an equivalent resistor of conductive liquid between the probe 11 and the g GND, and the R9 is an equivalent resistor of conductive liquid between the Vbus and the probe 11.

The first detection circuit 151 includes a first amplifier (A1), a first transistor (Q1), a first resistor (R1), a second resistor (R2), and a third resistor (R3). The A1 includes a first input end (A11), a second input end (A12), and an output end (A13). The A11 is connected to the first terminal of the RS using the R1. The A12 is connected to the second terminal of the RS using the second resistor R2. The A13 is connected to a base of the Q1. A collector of the Q1 is connected to the A12. An emitter of the Q1 is electrically connected to the processor 23 and is grounded using the R3.

The second detection circuit 153 includes a second amplifier (A2), a second transistor (Q2), a fourth resistor (R4), a fifth resistor (R5), and a sixth resistor (R6). The A2 includes a first input end (A21), a second input end (A22), and an output end (A23). The A21 is connected to the second terminal of the RS using the R4. The A22 is connected to the first terminal of the RS using the R5. The A23 is connected to a base of the Q2. A collector of the Q2 is connected to the A22. An emitter of the Q2 is electrically connected to the processor 23 and is grounded using the R6.

The switching circuit 13 includes a third transistor (Q3) and a seventh resistor (R7). A base of the Q3 is electrically connected to the processor 23. A collector of the Q3 is connected to the first terminal of the RS. An emitter of the Q3 is grounded using the R7. The processor 23 further includes a second enabling end (En2), and the base of the Q3 is electrically connected to the En2. When the processor 23 outputs a high level control signal using the En2, the Q3 is conducted, and the switching circuit 13 switches the first terminal of the RS to be grounded. When the processor 23 outputs a low level control signal using the En2, the Q3 is cut off, and the switching circuit 13 switches the first terminal of the RS to be ungrounded.

In this embodiment, the current in the first direction is a short-circuit current that forms after a current flows from the power circuit 21 to the probe 11 through the RS and the probe 11 is grounded using the GND, when a short circuit exists between the Vbus and the GND, and a voltage V1 at the first terminal of the RS is greater than a voltage V2 across the probe 11. The current in the second direction is a short-circuit current that forms after a current flows from the probe 11 through the RS and the RS is grounded using the switching circuit 13, when a short circuit exists between the Vbus and the GND, and the voltage V1 at the first terminal of the RS is less than the voltage V2 across the probe 11.

Further, when detecting that a peripheral device 30 (for example, a charger) is connected to the peripheral interface 25 of the user terminal 20, the processor 23 controls the power circuit 21 to power on the anti-short-circuit detection apparatus 10, and controls the switching circuit 13 to switch the first terminal of the RS to be ungrounded. In this case, it is assumed that the voltage at the first terminal of the RS is V1. If no short-circuit fault occurs between the Vbus and the GND, the probe 11 is in an unconnected state, and the power circuit 21 is connected to the probe 11 in an unconnected state using the RS. Therefore, the RS does not form a loop with the ground, and there is no current flowing through the RS. When there is no current flowing through the RS, an original output state in the detection circuit 15 keeps unchanged, and the user terminal 20 keeps in an original status.

If a short-circuit fault occurs between the Vbus and the GND, a short circuit exists between the probe 11 and the GND due to the R8, and a short circuit exists between the Vbus and the probe 11 due to the R9. It is assumed that the voltage across the probe 11 is V2. When the voltage V1 at the first terminal of the RS is greater than the voltage V2 across the probe 11, the power circuit 21 forms a loop with the ground after connecting to the RS and the R8, that is, a current Is1 in the first direction exists on the RS. The first detection circuit 151 detects the current Is1 in the first direction on the RS, and converts the current Is1 in the first direction into the Vo1. The current in the first direction includes Is1=(V1−V2)/RS. According to a virtual-short-circuit characteristic of an operational amplifier, voltages of the A11 and the A12 that are of the A1 are equal. In addition, according to a virtual-open-circuit characteristic of an operational amplifier, no current flowing into the A11 and the A12 that are of the A1 is equivalent to an open circuit. Therefore, the voltage at the A11 is equal to the voltage V1 at the first terminal of the RS. Therefore, it can be learnt that Vo1=V1. In addition, because of Vo1=V2×R3/(R2+R3), V2=Vo1×(R2+R3)/R3 holds true. In this way, the current in the first direction Is1=(Vo2−Vo1×(R2+R3)/R3)/RS can be obtained. According to the formula of the current Is1 in the first direction, when the first voltage Vo1 is zero, the current Is1 in the first direction is also zero. Therefore, the processor 23 can determine whether the current in the first direction flows through the RS by detecting whether the Vo1 of the first detection circuit 151 is zero. If the Vo1 is not zero, it indicates that a short-circuit fault occurs between the Vbus and the GND, and then, the processor 23 controls the user terminal 20 to issue a short-circuit warning or turn off the power circuit 21.

When the voltage V1 at the first terminal of the RS is less than the voltage V2 across the probe 11, because initially, the switching circuit 13 switches the first terminal of the RS to be ungrounded, the probe 11 does not form a loop with the ground after connecting to a branch circuit of the RS. That is, there is no current flowing through the RS, and therefore, the Vo1 is zero. It can be understood that when the processor 23 detects that the Vo1 is zero, it can only indicate that there is no current in the first direction flowing through the RS, but the following case cannot be excluded. The short circuit exists between the Vbus and the GND, and V1 is less than V2. Therefore, when detecting that the Vo1 is zero, the processor 23 controls the power circuit 21 to stop supplying power to the anti-short-circuit detection apparatus 10. In addition, the processor 23 controls, by outputting the high level control signal using the En2, the Q3 to be conducted, and the switching circuit 13 switches the first terminal of the RS to be grounded such that the Vbus forms a loop with the ground after sequentially connecting to the R9, the probe 11, the RS, and the switching circuit 13. In this case, a current Is2 in the second direction exists on the RS, and the second detection circuit 153 detects the current Is2 in the second direction on the RS, and converts the current Is2 in the second direction into the Vo2.

The current in the second direction includes Is2=(V2−V1)/RS. According to a virtual-short-circuit characteristic of an operational amplifier, voltages of the A21 and the A22 that are of the A2 are equal. In addition, according to a virtual-open-circuit characteristic of an operational amplifier, no current flowing into the A21 and the A22 that are of the A2 is equivalent to an open circuit. Therefore, the voltage at the A21 is equal to the voltage V2 across the probe 11. Therefore, it can be learnt that Vo2=V2. In addition, because of Vo2=V1×R6/(R7//(R5+R6)), V1=Vo2/R6×(R7//(R5+R6)) holds true. In this way, the current in the second direction Is2=(Vo2−Vo2/R6×(R7//(R5+R6)))/RS can be obtained. According to the formula of the current Is2 in the second direction, when the second voltage Vo2 is zero, the current Is2 in the second direction is also zero. Therefore, the processor 23 can determine whether the current in the second direction flows through the RS by detecting whether the Vo2 of the second detection circuit 153 is zero. If the Vo2 is not zero, it indicates that a short-circuit fault occurs between the Vbus and the GND, and then, the processor 23 controls the user terminal 20 to issue a short-circuit warning or turn off the power circuit 21. The expression R7//(R5+R6) represents a total resistance R obtained after connecting R7 in parallel with R5 and R6 that are connected in series. Further, for the total resistance R, the following relationship holds true: 1/R=1/R7+1/(R5+R6), that is, R=R7×(R5+R6)/(R5+R6+R7).

It can be understood that in the foregoing formulas, R2 is a resistance value of the second resistor, R3 is a resistance value of the third resistor, R5 is a resistance value of the fifth resistor, R6 is a resistance value of the sixth resistor, R7 is a resistance value of the seventh resistor, and RS is a resistance value of the detection resistor.

Figure 2:
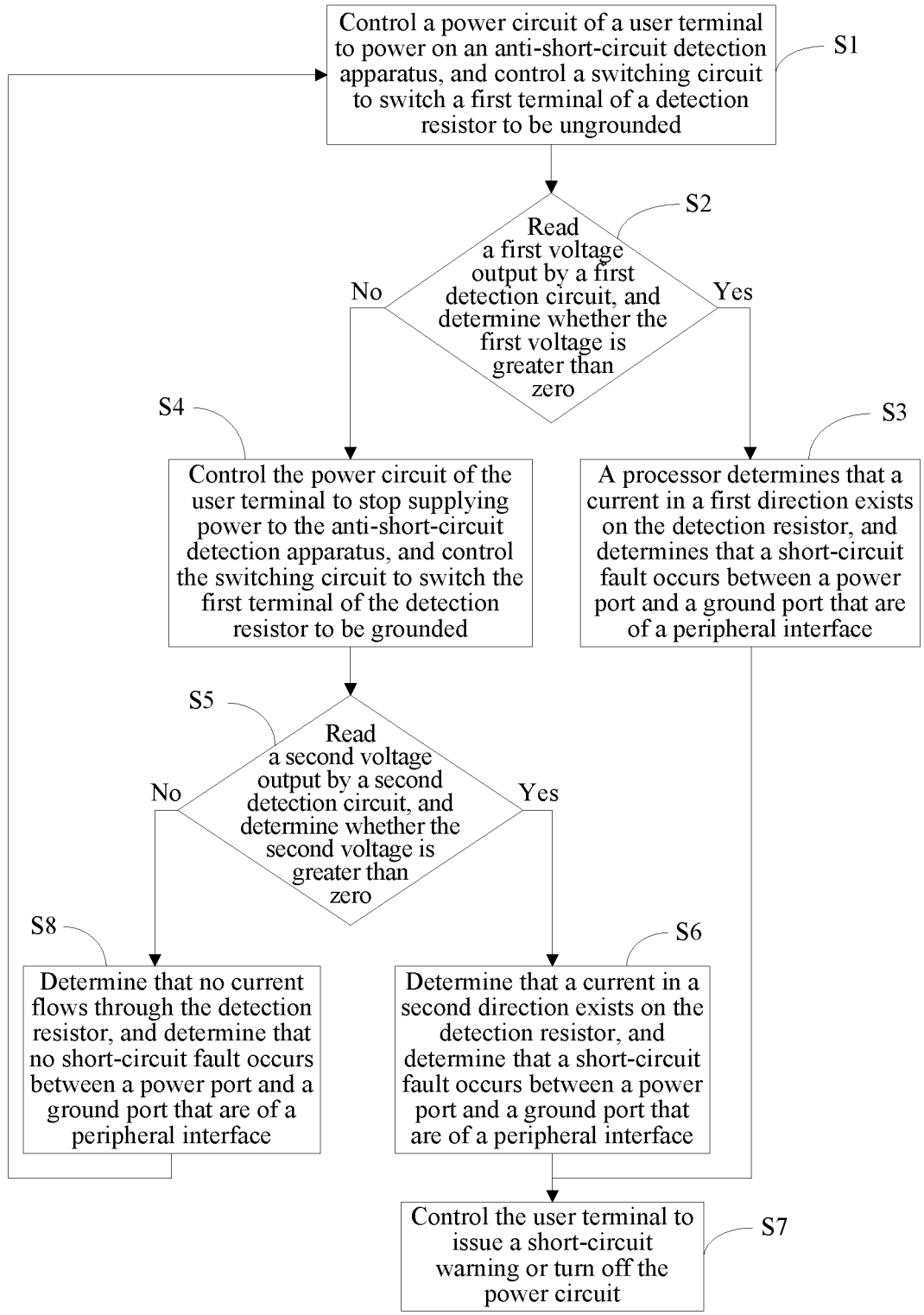
FIG. 2 is a schematic workflow diagram of the anti-short-circuit detection apparatus shown in FIG. 1.

Referring to FIG. 2, FIG. 2 is a schematic workflow diagram of the anti-short-circuit detection apparatus 10. Further, a workflow of the anti-short-circuit detection apparatus 10 includes the following steps.

Step S1: When detecting that a peripheral device is connected to a peripheral interface of a user terminal, a processor controls a power circuit of the user terminal to power on the anti-short-circuit detection apparatus, and controls a switching circuit to switch a first terminal of a detection resistor to be ungrounded.

Step S2: The processor reads a first voltage output by a first detection circuit, and determines whether the first voltage is greater than zero.

Step S3: If the first voltage is greater than zero, the processor determines that a current in a first direction exists on the detection resistor, and determines that a short-circuit fault occurs between a power port and a ground port that are of the peripheral interface, and then perform step S7.

Step S4: If the first voltage is not greater than zero, control the power circuit of the user terminal to stop supplying power to the anti-short-circuit detection apparatus, and control the switching circuit to switch the first terminal of the detection resistor to be grounded.

Step S5: The processor reads a second voltage output by a second detection circuit, and determines whether the second voltage is greater than zero.

Step S6: If the second voltage is greater than zero, the processor determines that a current in a second direction exists on the detection resistor, and determines that a short-circuit fault occurs between a power port and a ground port that are of the peripheral interface.

Step S7: When the short-circuit fault occurs between the power port and the ground port that are of the peripheral interface, control the user terminal to issue a short-circuit warning or turn off the power circuit.

Step S8: If the second voltage is not greater than zero, the processor determines that no current flows through the detection resistor, and determines that no short-circuit fault occurs between a power port and a ground port that are of the peripheral interface, and then perform step S1 and repeat the foregoing workflow.

An embodiment of the present disclosure further provides a user terminal 20, which includes a power circuit 21, a processor 23, a peripheral interface 25, and the anti-short-circuit detection apparatus 10 in the embodiment shown in FIG. 1. The peripheral interface 25 includes a Vbus and a GND. A probe 11 is disposed between the Vbus and the GND, and at least one portion of the probe 11 is located between the Vbus and the GND. The Vbus is electrically connected to the power circuit 21, and grounding is performed using the GND. The anti-short-circuit detection apparatus 10 is electrically connected to both the power circuit 21 and the processor 23, and is configured to detect whether a short-circuit fault occurs between the Vbus and the GND under the control of the processor 23, and trigger the processor 23 to control the user terminal 20 to issue a short-circuit warning or turn off the power circuit 21 when a short-circuit fault occurs between the Vbus and the GND.

Figure 3:
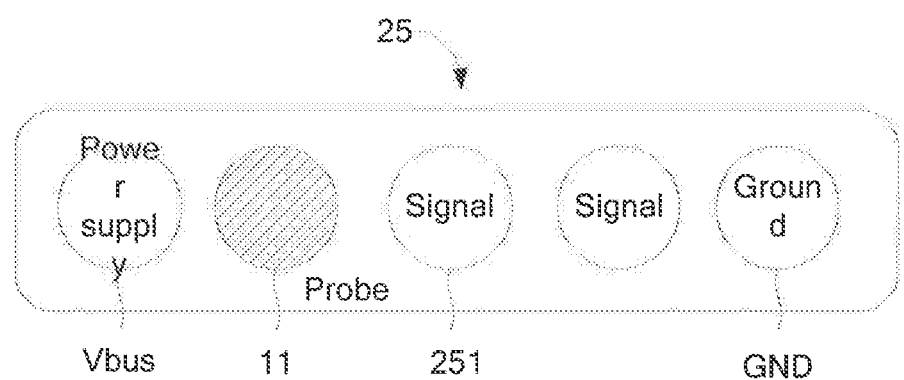
FIG. 3 is a schematic structural diagram of a peripheral interface of a user terminal according to an embodiment of the present disclosure.

Referring to FIG. 3, in a possible implementation, the peripheral interface 25 includes a Vbus, a GND, and at least one signal port 251 that are disposed separately. The probe 11 is disposed between the Vbus and the GND. Further, the Vbus and the GND are respectively disposed at two opposite ends of the peripheral interface 25. The at least one signal port 251 is disposed between the Vbus and the GND. In this embodiment, the probe 11 is disposed between the Vbus and the signal port 251 that is adjacent to the Vbus. It can be understood that the probe 11 may be disposed at any port interval between the Vbus and the GND.

Figure 4:
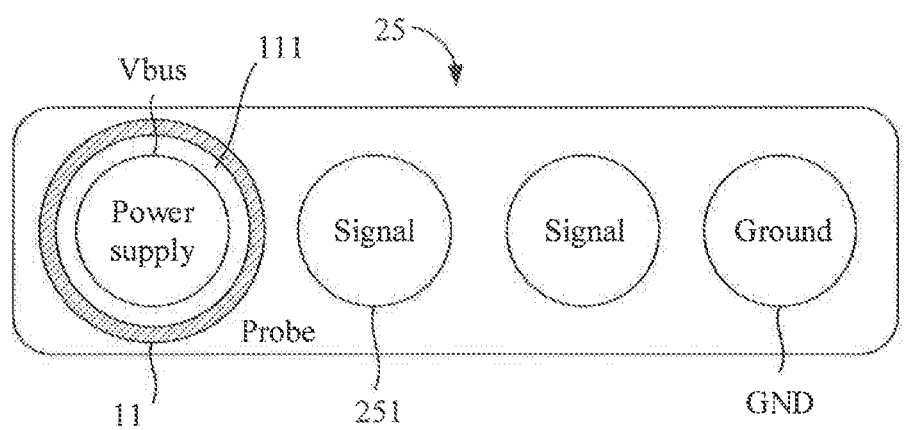
FIG. 4 is another schematic structural diagram of a peripheral interface of a user terminal according to an embodiment of the present disclosure.

Referring to FIG. 4, in a possible implementation, the probe 11 is disposed around the Vbus. Further, the probe 11 is disposed around the Vbus, forming a ring gap 111 between the probe 11 and the Vbus. When no short-circuit fault occurs between the Vbus and the GND, the probe 11 and the Vbus are separated by the gap 111. When a short-circuit fault occurs between the Vbus and the GND, for example, a short circuit exists between the Vbus and the GND due to conductive liquid, because at least one portion of the probe 11 is located between the Vbus and the GND, a short circuit also exists between the probe 11 and the Vbus and a short circuit also exists between the probe 11 and the GND. In this case, a voltage V2 is formed across the probe 11, and according to a voltage difference between the voltage V2 and a voltage V1 at a first terminal of an RS, a current in a first direction or a current in a second direction is formed across the RS. This helps the processor 23 determine whether a port fault occurs between the Vbus and the GND, by detecting the current in the first direction or the current in the second direction by the detection circuit 15 as shown in FIG. 1.

It can be understood that for a structure and function implementation of the anti-short-circuit detection apparatus 10, reference may be made to the related descriptions in the embodiments shown in FIG. 1 and FIG. 2 of the present disclosure. Details are not repeated herein.

In the anti-short-circuit detection apparatus 10, the probe 11 is disposed between the Vbus and the GND, the probe 11 is electrically connected to the power circuit 21 of the user terminal 20 using the RS, and the switching circuit 13 may perform switching to be grounded such that whether a short-circuit fault occurs between the Vbus and the GND can be determined by detecting, by the detection circuit 15, whether a short-circuit current exists on the RS, and when a short-circuit fault occurs between the Vbus and the GND, the user terminal 20 is triggered to issue a short-circuit warning or turn off the power circuit 21. This can effectively prevent parts and components of the user terminal 20 from being damaged because of the short-circuit fault.

What is disclosed above is merely examples of embodiments of the present disclosure, and certainly is not intended to limit the scope of the claims of the present disclosure. A person of ordinary skill in the art can understand that all or some of procedures for implementing the foregoing embodiments and equivalent modifications made in accordance with the claims of the present disclosure shall fall within the scope of the present disclosure.

What is claimed is:

1. An anti-short-circuit detection apparatus, applied to detect whether a short circuit exists between a power port and a ground port of a user terminal, comprising:
   a probe disposed between the power port and the ground port;
   a detection resistor coupled to the probe, a first terminal of the detection resistor electrically coupled to a power circuit of the user terminal and configured to obtain an auxiliary voltage from the power circuit, and a second terminal of the detection resistor electrically coupled to the probe;
   a switching circuit electrically coupled to the first terminal of the detection resistor and a processor of the user terminal, the switching circuit configured to switch the first terminal of the detection resistor to be grounded or ungrounded under the control of the processor; and
   a detection circuit electrically coupled to the two terminals of the detection resistor and the processor, wherein the detection circuit comprises:
      a first detection circuit and a second detection circuit, and when the switching circuit switches the first terminal of the detection resistor to be ungrounded, the first detection circuit is configured to:
         detect a first current in a first direction on the detection resistor; and
         convert the first current into a first voltage, and when the switching circuit switches the first terminal of the detection resistor to be grounded, the second detection circuit is configured to:
         detect a second current in a second direction on the detection resistor; and
         convert the second current into a second voltage, wherein the anti-short-circuit apparatus is configured to:
      detect a short-circuit current on the detection resistor; and
      trigger the processor to control the user terminal to issue a short-circuit warning or turn off the power circuit when the short-circuit current is not zero.

2. The anti-short-circuit detection apparatus of claim 1, further comprising a diode, a positive electrode of the diode electrically coupled to the power circuit, a negative electrode of the diode electrically coupled to the first terminal of the detection resistor, the first current flows from the power circuit to the probe through the diode and the detection resistor, the probe grounded using a first short-circuit resistance, the second current flows from the power port to the detection resistor through a second short-circuit resistance and the probe, and the detection resistor grounded using the switching circuit.

3. The anti-short-circuit detection apparatus of claim 1, wherein the first detection circuit comprises a first amplifier, a first transistor, a first resistor, a second resistor, and a third resistor, wherein the first amplifier comprises a first input end, a second input end, and an output end, and wherein the first input end is coupled to the first terminal of the detection resistor using the first resistor, the second input end is coupled to the second terminal of the detection resistor using the second resistor, the output end is coupled to a base of the first transistor, a collector of the first transistor is coupled to the second input end, and an emitter of the first transistor is electrically coupled to the processor and is grounded using the third resistor.

4. The anti-short-circuit detection apparatus of claim 3, wherein when a voltage at the first terminal of the detection resistor is greater than a voltage at a location of the probe, a direction of a current on the detection resistor comprises the first direction, and a relationship between the first current Is1 and the first voltage Vo1 comprises:
   $Is1 = (Vo1 - Vo1 \times (R2+R3)/R3)/RS$, wherein R2 is a resistance value of the second resistor, R3 is a resistance value of the third resistor, and RS is a resistance value of the detection resistor.

5. The anti-short-circuit detection apparatus of claim 1, wherein the second detection circuit comprises a second amplifier, a second transistor, a fourth resistor, a fifth resistor, and a sixth resistor, the second amplifier comprising a first input end, a second input end, and an output end, the first input end coupled to the second terminal of the detection resistor using the fourth resistor, the second input end coupled to the first terminal of the detection resistor using the fifth resistor, the output end coupled to a base of the second transistor, a collector of the second transistor coupled to the second input end, and an emitter of the second transistor electrically coupled to the processor and grounded using the sixth resistor.

6. The anti-short-circuit detection apparatus of claim 5, wherein the switching circuit comprises a third transistor and a seventh resistor, wherein a base of the third transistor is electrically coupled to the processor, a collector of the third transistor is coupled to the first terminal of the detection resistor, and wherein an emitter of the third transistor is grounded using the seventh resistor.

7. The anti-short-circuit detection apparatus of claim 6, wherein when a voltage at the first terminal of the detection resistor is less than a voltage at a location of the probe, a direction of a current on the detection resistor comprises the second direction, and a relationship between the second current Is2 and the second voltage Vo2 comprises:

Is2=(Vo2−Vo2/R6×(R7//(R5+R6)))/RS, wherein R5 is a resistance value of the fifth resistor, R6 is a resistance value of the sixth resistor, R7 is a resistance value of the seventh resistor, and RS is a resistance value of the detection resistor.

8. A user terminal, comprising:
a peripheral interface comprising a power port and a ground port;
an anti-short-circuit detection apparatus coupled to the peripheral interface and comprising:
  a probe disposed between the power port and the ground port;
  a detection resistor coupled to the probe, a first terminal of the detection resistor electrically coupled to a power circuit of the user terminal and configured to obtain an auxiliary voltage from the power circuit, and a second terminal of the detection resistor electrically coupled to the probe;
  a switching circuit electrically coupled to the first terminal of the detection resistor and a processor of the user terminal the switching circuit configured to switch the first terminal of the detection resistor to be grounded or ungrounded under the control of the processor; and
a detection circuit electrically coupled to the two terminals of the detection resistor and the processor, wherein the detection circuit comprises:
  a first detection circuit and a second detection circuit, wherein when the switching circuit switches the first terminal of the detection resistor to be ungrounded, the first detection circuit is configured to:
    detect a current in a first direction on the detection resistor; and
    convert the current in the first direction into a first voltage, and when the switching circuit switches the first terminal of the detection resistor to be grounded, the second detection circuit is configured to:
    detect a current in a second direction on the detection resistor; and
    convert the current in the second direction into a second voltage,
  wherein the anti-short-circuit apparatus is configured to:
detect a short-circuit current on the detection resistor; and
trigger the processor to control the user terminal to issue a short-circuit warning or turn off the power circuit when the short-circuit current is not zero.

9. The user terminal of claim 8, wherein the probe is disposed around the power port.

10. A short-circuit detection method to detect whether a short-circuit exists between a power port and a ground port of a user terminal, the short-circuit detection method comprising:
detecting that a peripheral device is connected to a peripheral interface of a user terminal;
controlling a power circuit of the user terminal to power on short-circuit detection apparatus comprising a detection circuit having a first detection circuit and a second detection circuit;
controlling a switching circuit to switch a first terminal of a detection resistor to an ungrounded state;
reading a first voltage output by the first detection circuit, and determining whether the first voltage is greater than zero, and when the first voltage is greater than zero:
  determining that a current in a first direction exists on the detection resistor, and
  thereby determining that a short-circuit fault exists between the power port and the ground port of the peripheral interface, and then controlling the user terminal to issue a short-circuit warning or turn off the power circuit;
and when the first voltage is not greater than zero:
  controlling the power circuit of the user terminal to stop supplying power to the short-circuit detection apparatus;
  controlling the switching circuit to switch the first terminal of the detection resistor to a grounded state;
  reading a second voltage output by the second detection circuit, and determining when the second voltage is greater than zero;
  when the second voltage is greater than zero, determining that a current in a second direction exists on the detection resistor, and determining that a short-circuit fault occurs between a power port and a ground port of the peripheral interface and then controlling the user terminal to issue a short-circuit warning or turn off the power circuit;
and when the second voltage is not greater than zero:
  determining that no current flows through the detection resistor, and that no short-circuit fault exists between the power port and the ground port, and then repeating the steps to provide continuous short-circuit detection.

11. The short-circuit detection method of claim 10, further comprising:
disposing a probe between the power port and the ground port;
electrically coupling the first terminal of the detection resistor to the power circuit of the user terminal to obtain an auxiliary voltage from the power circuit, and electrically coupling a second terminal of the detection resistor to the probe;
electrically coupling the switching circuit to the first terminal of the detection resistor and to a processor operable for switching the first terminal of the detection resistor to a grounded state or an ungrounded state; and
electrically coupling the detection circuit to the two terminals of the detection resistor and the processor, whereby:
switching the first terminal of the detection resistor to the ungrounded state, whereby the detection circuit detects when current flows in the first direction on the detection resistor and converts the first current into the first voltage; and
switching the first terminal of the detection resistor to the grounded state, whereby the detection circuit detects when current flows in the second direction on the detection resistor and converts the second current into the second voltage, whereby:
a short-circuit current is detected when one or more of the first and second voltages is not zero; and
controlling the user terminal to issue a short-circuit warning or turn off the power circuit when a short-circuit current is detected.

12. The short-circuit detection method of claim 10, further comprising operably coupling a positive electrode of a diode to the power circuit and a negative electrode of the diode to the first terminal of the detection resistor, whereby the first current flows from the power circuit to the probe through the diode and the detection resistor, whereby the probe is grounded using a first short-circuit resistance, whereby the second current flows from the power port to the detection resistor through a second short-circuit resistance and the probe, and wherein the detection resistor is grounded by the switching circuit.

13. The short-circuit detection method of claim 11, wherein the detection circuit comprises a first amplifier, a first transistor, a first resistor, a second resistor, and a third resistor, wherein the first amplifier comprises a first input end, a second input end, and an output end, and wherein the first input end is coupled to the first terminal of the detection resistor using the first resistor, the second input end is coupled to the second terminal of the detection resistor using the second resistor, the output end is coupled to a base of the first transistor, a collector of the first transistor is coupled to the second input end, and an emitter of the first transistor is electrically coupled to the processor and is grounded using the third resistor.

14. The short-circuit detection method of claim 13, wherein the detection circuit further comprises a second amplifier, a second transistor, a fourth resistor, a fifth resistor, and a sixth resistor, wherein the second amplifier comprises a first input end, a second input end, and an output end, and wherein the first input end is coupled to the second terminal of the detection resistor using the fourth resistor, the second input end is coupled to the first terminal of the detection resistor using the fifth resistor, the output end is coupled to a base of the second transistor, a collector of the second transistor is coupled to the second input end, and an emitter of the second transistor is electrically coupled to the processor and is grounded using the sixth resistor.

15. The short-circuit detection method of claim 14, wherein the switching circuit comprises a third transistor and a seventh resistor, and wherein a base of the third transistor is electrically coupled to the processor, a collector of the third transistor is coupled to the first terminal of the detection resistor, and an emitter of the third transistor is grounded using the seventh resistor.

16. The short-circuit detection method of claim 15, wherein when a voltage at the first terminal of the detection resistor is less than a voltage at a location of the probe, a direction of a current on the detection resistor comprises the second direction, a relationship between the second current $Is2$ and the second voltage $Vo2$ comprises:

$Is2=(Vo2-Vo2/R6\times(R7//(R5+R6)))/RS$, wherein $R5$ is a resistance value of the fifth resistor, $R6$ is a resistance value of the sixth resistor, $R7$ is a resistance value of the seventh resistor, and $RS$ is a resistance value of the detection resistor.

17. The short-circuit detection method of claim 13, wherein when a voltage at the first terminal of the detection resistor is greater than a voltage at a location of the probe, a direction of a current on the detection resistor comprises the first direction, a relationship between the first current $Is1$ and the first voltage $Vo1$ comprises:

$Is1=(Vo1-Vo1\times(R2+R3)/R3)/RS$, wherein $R2$ is a resistance value of the second resistor, $R3$ is a resistance value of the third resistor, and $RS$ is a resistance value of the detection resistor.

* * * * *